United States Patent
Mitchell et al.

(10) Patent No.: US 11,309,915 B1
(45) Date of Patent: Apr. 19, 2022

(54) EFFICIENT IMPLEMENTATION OF A THRESHOLD MODIFIED MIN-SUM ALGORITHM FOR LOW-DENSITY PARITY-CHECK DECODERS

(71) Applicant: Arrowhead Center, Inc., Las Cruces, NM (US)

(72) Inventors: David G. Mitchell, Las Cruces, NM (US); Yanfang Liu, Las Cruces, NM (US)

(73) Assignee: Arrowhead Center, Inc., Las Cruces, NM (US)

( * ) Notice: Subject to any disclaimer, the term of this patent is extended or adjusted under 35 U.S.C. 154(b) by 71 days.

(21) Appl. No.: 16/872,106

(22) Filed: May 11, 2020

Related U.S. Application Data

(60) Provisional application No. 62/873,061, filed on Jul. 11, 2019.

(51) Int. Cl.
*H03M 13/00* (2006.01)
*H03M 13/11* (2006.01)
*H03M 9/00* (2006.01)

(52) U.S. Cl.
CPC ..... *H03M 13/1128* (2013.01); *H03M 13/616* (2013.01); *H03M 9/00* (2013.01)

(58) Field of Classification Search
CPC ... H03M 13/1128; H03M 13/616; H03M 9/00
See application file for complete search history.

(56) References Cited

U.S. PATENT DOCUMENTS 7,477,694 B2    1/2009  Sanderford et al.
8,266,493 B1 *  9/2012  Abbaszadeh ........ H03M 13/116
                                                714/752
(Continued)

FOREIGN PATENT DOCUMENTS

CN    104205647 A    12/2014
CN    109936379 A     6/2019
(Continued)

OTHER PUBLICATIONS

Abdu-Aguye, Umar-Faruk, "On Lowering the Error-Floor of Short-to-Medium Block Length Irregular Low Density Parity-Check Codes", A thesis submitted to Plymouth University in partial fulfillment for the degree of Doctor of Philosophy, Oct. 2017.

(Continued)

*Primary Examiner* — Samir W Rizk
(74) *Attorney, Agent, or Firm* — Peacock Law P.C.; Justin R. Jackson

(57) ABSTRACT

A hardware efficient implementation of a threshold modified attenuated min-sum algorithm ("TAMSA") and a threshold modified offset min-sum algorithm ("TOMSA") that improve the performance of a low density parity-check ("LDPC") decoder by reducing the bit error rate ("BER") compared to the conventional attenuated min-sum algorithm ("AMSA"), offset min-sum algorithm ("OMSA"), and the min-sum algorithm ("MSA"). Embodiments of the present invention preferably use circuit optimization techniques, including a parallel computing structure and lookup tables, and a field-programmable gate array ("FPGA") or application specific integrated circuit ("ASIC") implementation.

26 Claims, 5 Drawing Sheets

(56) References Cited

U.S. PATENT DOCUMENTS

| | | | |
|---|---|---|---|
| 8,359,522 | B2 | 1/2013 | Gunnam et al. |
| 8,549,375 | B2 | 10/2013 | Ueng et al. |
| 8,621,318 | B1 | 12/2013 | Micheloni et al. |
| 8,689,074 | B1 | 4/2014 | Tai |
| 8,689,084 | B1 | 4/2014 | Tai |
| 8,898,537 | B2 | 11/2014 | Gross et al. |
| 8,984,376 | B1 | 3/2015 | Norrie |
| 8,990,661 | B1 | 3/2015 | Micheloni et al. |
| 9,100,153 | B2 | 8/2015 | Gross et al. |
| 9,450,610 | B1 | 9/2016 | Micheloni et al. |
| 9,590,656 | B2 | 3/2017 | Micheloni et al. |
| 9,608,666 | B1 | 3/2017 | Morero et al. |
| 9,813,080 | B1 | 11/2017 | Micheloni et al. |
| 10,103,751 | B2 | 10/2018 | Morero et al. |
| 10,230,396 | B1 | 3/2019 | Micheloni et al. |
| 10,305,513 | B2 | 4/2019 | Lee et al. |
| 10,284,293 | B2 | 5/2019 | Bitra et al. |
| 10,374,632 | B2 | 8/2019 | Zhang et al. |
| 10,778,248 | B1* | 9/2020 | Wu .................... H03M 13/1117 |
| 2007/0089019 | A1 | 4/2007 | Tang et al. |
| 2010/0131819 | A1* | 5/2010 | Graef ................. G06F 11/1004 714/752 |
| 2010/0162075 | A1 | 6/2010 | Brannstrom et al. |
| 2010/0306617 | A1 | 12/2010 | Kondo et al. |
| 2011/0231731 | A1 | 9/2011 | Gross et al. |
| 2012/0221914 | A1 | 8/2012 | Morero et al. |
| 2013/0086445 | A1 | 4/2013 | Yedidia et al. |
| 2014/0068394 | A1 | 3/2014 | Zhang et al. |
| 2014/0201594 | A1 | 7/2014 | Zhu et al. |
| 2016/0134305 | A1 | 5/2016 | Morero et al. |
| 2017/0085276 | A1* | 3/2017 | Prabhakar ......... H03M 13/3707 |
| 2017/0264316 | A1 | 9/2017 | Lee et al. |
| 2020/0136653 | A1 | 4/2020 | Kim |

FOREIGN PATENT DOCUMENTS

| | | |
|---|---|---|
| EP | 2245772 B1 | 4/2019 |
| JP | 6396977 B2 | 9/2018 |
| TW | 201119247 A | 6/2011 |
| WO | 2019013662 A1 | 1/2019 |
| WO | 2019205313 A1 | 10/2019 |

OTHER PUBLICATIONS

All Answers Limited, "Adaptive FPGA-based LDPC-coded Manipulation", https://ukdiss.com/examples/adaptive-fpga-based-ldpc-coded-modulation.php, Nov. 2018.

Angarita, Fabian, et al., "Reduced-Complexity Min-Sum Algorithm for Decoding LDPC Codes with Low Error-Floor", IEEE Transactions on Circuits and Systems, vol. 61, No. 7, Jul. 2014, 2150-2158.

Chen, Jinghu, et al., "Reduced-Complexity Decoding of LDPC Codes", IEEE Transactions on Communications, vol. 53, No. 8, Aug. 2005, 1288-1299.

Darabiha, Ahmad, et al., "A Bit-Serial Approximate Min-Sum LDPC Decoder and FPGA Implementation", ISCAS 2006, IEEE, 2006, 149-152.

Fossorier, Marc P.C., et al., "Reduced Complexity Iterative Decoding of Low-Density Parity Check Codes Based an Belief Propagation", IEEE Transactions on Communications, vol. 47, No. 5, May 1999, 673-680.

Hailes, Peter, et al., "Hardware-Efficient Node Processing Unit Architectures for Flexible LDPC Decoder Implementations", IEEE Transactions on Circuits and Systems-II: Express Briefs, vol. 65, No. 12, Dec. 2018, 1919-1923.

Han, Yang, et al., "LDPC Decoder Strategies for Achieving Low Error Floors", Conference Paper, 2008 Information Theory and Applications Workshop, downloaded from IEEE Xplore, 2008.

He, Huanyu, et al., "A New Low-Resolution Min-Sum Decoder Based on Dynamic Clipping for LDPC Codes", Conference Paper, IEEE/CIC International Conference on Communications in China (ICCC), downloaded on Feb. 24, 2021 fom IEEE Xplore, 2019, 636-640.

Lechner, Gottfried, "Efficient Decoding Techniques for LDPC Codes", https://publik.tuwien.ac.at/files/pub-et_12989.pdf, Jul. 2007.

Siegel, Paul H., "An Introduction to Low-Density Parity-Check Codes", http://cmrr-star.ucsd.edu/static/presentations/ldpc_tutorial.pdf, May 31, 2007.

Song, Suwen, et al., "A Reduced Complexity Decoding Algorithm for NB-LDPC Codes", Conference Paper, 17th IEEE International Conference on Communication Technology, downloaded Feb. 24, 2021 from IEEE Xplore, 2017, 127-131.

Tanner, R. Michael, et al., "LDPC Block and Convolutional Codes Based on Circulant Matrices", IEEE Transactions on Information Theory, VI 50, No. 12, Dec. 2004, 2966-2984.

Tehrani, Seced Sharifi, "Stochastic Decoding of Low-Density Parity-Check Codes", Thesis submitted to McGill University in partial fulfillment of the requirements of the degree of Doctor of Philosophy, 2011.

Tehrani, S., et al., "Stochastic decoding of low-density parity-check codes", Computer Science (abstract only), 2011.

Vasic, Bane, et al., "Failures and Error-Floors of Iterative Decoders", In Preparation for Channel, Coding Section of the Elsevier Science E-Book Serires, Dec. 2012.

Yu, Hui, et al., "Systematic construction, verification and implementation methodology for LDPC codes", EURASIP Journal on Wireless Communications and Networking, http://jwcn.eurasipjournals.com/content/2012/1/84, 2012.

Zhao, Jianguang, et al., "On Implementation of Min-Sum Algorithm and Its Modifications for Decoding Low-Density Parity-Check (LDPC) Codes", IEEE Transactions on Communications, vol. 53, No. 4, Apr. 2005, 549-554.

Quasi-cyclic Low Density Parity-check code (QC-LDPC), https://arxiv.org/ftp/arxiv/papers/1511/1511.00133.pdf, Downloaded Nov. 27, 2019.

Howard, et al., "Soft-bit decoding of regular low-density parity-check codes," in IEEE Transactions on Circuits and Systems II: Express Briefs, vol. 52, No. 10, pp. 646-650, Oct. 2005.

Liu, et al., "Variable-Node-Based Belief-Propagation Decoding With Message Pre-Processing for NANO Flash Memory," in IEEE Access, vol. 7, pp. 58638-58653, 2019.

Kudekar, et al., "The effect of saturation on belief propagation decoding of LDPC codes," 2014 IEEE International Symposium on Information Theory, 2014, pp. 2604-2608.

\* cited by examiner

EFFICIENT IMPLEMENTATION OF A THRESHOLD MODIFIED MIN-SUM ALGORITHM FOR LOW-DENSITY PARITY-CHECK DECODERS

CROSS-REFERENCE TO RELATED APPLICATIONS

This application claims priority to and the benefit of the filing of U.S. Provisional Patent Application No. 62/873,061, entitled "Threshold-Based Min-Sum Algorithm to Lower the Error Floors of Quantized Low-Density Parity-Check Decoders", filed on Jul. 11, 2019, and the specification thereof is incorporated herein by reference.

STATEMENT REGARDING FEDERALLY SPONSORED RESEARCH OR DEVELOPMENT

This invention was made with government support from the National Science Foundation under grant numbers ECCS-1710920 and OIA-1757207. The government has certain rights in the invention.

BACKGROUND OF THE INVENTION

As a class of linear block codes, low-density parity-check ("LDPC") codes were originally proposed in the 1960's, but were not considered practical for a long time due to prohibitive hardware requirements. LDPC codes were rediscovered in the 1990's and were shown to be capable of approaching channel capacity with low-complexity iterative message passing ("MP") decoding. Since then, significant effort has been made to develop hardware efficient decoders and LDPC codes. LDPC codes have been widely adopted in practice for reliable communication and storage of information (including for example, cellular data (5G), wifi, optical communication, magnetic recording, and flash memories), and are used in many communication standards, including IEEE 802.6, IEEE 802.20, IEEE 802.3, digital video broadcasting-satellite second generation ("DVB-RS2"), and China mobile multimedia broadcasting ("CMMB"). Hardware implementation of LDPC decoders involves iteratively passing quantized messages between processing units on a chip. To reduce implementation and usage costs (e.g., power, area, speed), an approximation to the exact algorithm, called the min-sum algorithm ("MSA"), is typically employed. The MSA is widely used for hardware implementation of LDPC decoders because no estimation of the channel signal-to-noise ratio ("SNR") is needed over the additive white Gaussian noise ("AWGN") channel, as well as its low complexity and robustness against quantization error. However, the MSA incurs a degradation in performance when compared to the more complex sum product algorithm ("SPA") due to approximations involved in the message computation. Empirically, MSA is observed to have little degradation in performance compared to the SPA for short code lengths, but for long code lengths the degradation can vary from several tenths of a decibel ("dB") to one dB.

To improve the decoding performance, two modifications of MSA, called attenuated (or normalized) MSA ("AMSA") and offset MSA ("OMSA") were formed to reduce the approximation error. Both variants have been shown to achieve better bit error rate ("BER") performance at low to moderate SNRs when compared to the conventional MSA. Moreover, to save hardware resources, a layered version of MSA, AMSA, and OMSA have been employed and shown to have faster convergence speed, reducing iterations and decoder power consumption, as well as circuit area [13], [14], [15], [16].

To further improve the performance of quantized LDPC decoders, threshold AMSA ("TAMSA") and threshold OMSA ("TOMSA") were developed. The TAMSA and TOMSA selectively attenuate (offsets) the outgoing log-likelihood ratio ("LLR") message used to update a variable node during MP decoding of an LDPC code if this value has a magnitude below some threshold $\tau$, while allowing an LLR to reach the maximum quantizer level if the magnitude is greater than $\tau$. Given that most of the decoding failures in the high SNR regime occur due to problematic graphical objects that are randomly distributed in the Tanner graph of LDPC codes, it has been shown that the new algorithms are less prone to decoding failures and can significantly improve the performance when compared to AMSA and OMSA.

There is thus a present need for a system that implements the TAMSA and/or TOMSA algorithm using look-up tables ("LUTs"), or alternative methods, for message quantization and attenuation and/or offset, and which also provides a layered TAMSA and/or TOMSA algorithm to reduce hardware cost.

To demonstrate an embodiment of the present invention, a (155, 64) Tanner code can be used, which provides desirable results for hardware implementation due to its quasi-cyclic ("QC") structure. Simulation results of MSA, AMSA, TAMSA, and layered TAMSA show (in FIG. 2) that the layered TAMSA decoder gains approximately 0.4 dB at a bit error rate ("BER") equal to $10^{-9}$ over the MSA and AMSA, with a 0.1 dB performance gain compared to TAMSA. Embodiments of the present invention can be implemented with hardware according to the QC structure, including but not limited to a full-parallel architecture to speed up the decoding process. As a result of the LUT-based approach, the performance gain achieved by the layered TAMSA of an embodiment of the present invention is achieved with no extra hardware cost when compared to AMSA by comparing the LUT, leaf cell, power, and area values from the synthesis results, and only 0.07% extra leaf cells compared to conventional MSA.

Embodiments of the present invention relate to an apparatus that selectively attenuates and/or offsets the messages in a low-density parity-check ("LDPC") decoder based on a simple threshold comparison test.

LDPC codes are error-correcting codes that have been widely adopted in practice for reliable communication and storage of information, e.g., cellular data, including 5G, wi-fi, optical communication, space and satellite communication, magnetic recording, flash memories, and so on. Implementation of LDPC decoders involves iteratively passing quantized messages between processing units on the chip. To reduce implementation and usage costs (e.g., power, area, speed), an approximation to the usual algorithm, called the MSA, is employed. Variants of min-sum are used in practice to adjust for the error in approximation and to improve error correction performance. These variants use an attenuation or offset (reduction) in the message values that are passed. Known implementations use a uniform attenuation or offset, meaning that the messages passed are all reduced in value in the same way.

Currently, known systems and/or algorithms can outperform conventional state-of-the-art "AMSA" or "OMSA" algorithms with optimized parameters. To lower the error floor via the decoder, existing solutions include:
Accept errors and employ post-processing, thus increasing chip space, power consumption, and latency;

Request re-transmission ("HARQ"), which requires a feedback channel and adds latency, transmission power, and decoder power; and/or Increase message precision (more bits for quantization), which increases hardware cost and memory requirements.

More specifically, LDPC codes are a class of linear block codes for which the performance of iterative message passing ("MP") decoding can approach that of much more complex maximum likelihood ("ML") decoding. The min-sum algorithm ("MSA") is a simplified version of the sum-product algorithm ("SPA") that is commonly used for iterative MP decoding of LDPC codes, where the check node computation is approximated and hence is significantly easier to perform. This simplification is particularly desirable for hardware decoder implementations. Moreover, unlike the SPA, no estimation of the channel signal-to-noise ratio ("SNR") is needed at the receiver for an additive white Gaussian noise ("AWGN") channel.

Practical implementations of LDPC decoders require a finite precision (quantized) representation of the LLRs. Existing implementations use a uniform attenuation or offset (i.e., the messages passed are all reduced in value in the same way). Quantized density evolution ("DE") has been used to find the optimum attenuation and offset parameters for the AMSA and OMSA, in the sense that DE calculates the iterative decoding threshold, which characterizes the waterfall performance. Further improvements to the waterfall performance of the MSA for quantized and unquantized decoders have been made. At high SNRs, quantization typically causes the early onset of an error floor. It has been shown that certain objects, called trapping sets, elementary trapping sets, leafless elementary trapping sets, or absorbing sets, in the Tanner graph, cause the iterative decoding process to get stuck, resulting in decoding errors at high SNRs. Hereafter, the sub-graphs induced by these sets, as well as similar sets, are referred to as problematic graphical objects. Several methods based on problematic objects have been proposed to estimate the performance of LDPC codes and a number of strategies have been proposed to lower the error floor of quantized LDPC decoders, including quantizer design, modifications to iterative decoding, and post-processing.

There is thus a present need for a system which can implement a modified MSA that can outperform MSA, AMSA, and OMSA across all SNRs. More particularly, there is a present need for a system that selectively attenuates or offsets the messages based on a simple threshold value comparison.

BRIEF SUMMARY OF EMBODIMENTS OF THE PRESENT INVENTION

An embodiment of the present invention relates to a method for implementing a threshold modified min-sum algorithm for a low-density parity check ("LDPC") decoder that includes quantization of received channel values, converting serial input data to parallel input data, storing the parallel input data in random access memory ("VRAM"), based on data contained in a parity check matrix, a decoding controller causing an address generator to generate addresses to access data stored in the VRAM, passing VRAM data to a check node unit ("CNU"), the CNU calculating minimum values of the data passed to the CNU, storing the calculated minimum values to random access memory, calculating iterations of variable node log-likelihood ratios ("LLRs") and storing the calculated iterations of LLRs to VRAM, after each iteration, making a hard decision based on a sign of the calculated iteration of the variable node LLR to determine whether a codeword is valid, and when the hard decision determines that the codeword is valid, passing final data to an output. The CNU can convert serial input into parallel data and process the parallel data in a parallel architecture. The CNU can calculate minimum and sub-minimum values of the data passed to the CNU. In one embodiment, storing the calculated minimum values into CRAM can include storing the calculated minimum and sub-minimum values into CRAM. A circuit can be used to calculate a sub-minimum value which comprises one less data input than a circuit used to calculate a minimum value.

A variable node message can be equal to a minimum value and the calculated sub-minimum value can be assigned as the minimum value for calculations in the CNU. When a variable node message is not equal to a minimum value, the calculated minimum value can be assigned as the minimum value for calculations in the CNU. In one embodiment, quantized LLR values can be assigned according to a lookup table and all decoder operations can be performed on corresponding binary value strings. The CNU preferably converts LLRs from previous iterations into parallel data and the CNU preferably converts minimum values from previous iterations into parallel data and passes LLRs from previous iterations and minimum values from previous iterations to a plurality of full subtractor modules. The parallel outputs of the LLRs are also preferably passed to a plurality of full adder modules. The plurality of full adder modules preferably adds the LLRs with data from a lookup table. Optionally, sign and magnitude values to be sent to nodes can be calculated separately from one another. The plurality of full subtractor modules is preferably based on data contained in a parity-check matrix. The plurality of full adder modules is preferably based on data contained in a parity check matrix.

In one embodiment, signs of all variable nodes connected to a check node are preferably multiplied together. A sign of an outgoing message to each variable node is preferably computed by multiplying with a sign of a corresponding variable node. When the hard decision determines that a codeword is not valid, a current number of iterations can be compared to a predetermined maximum iteration number and if the current number of iterations is smaller than the predetermined maximum iteration number, the method preferably continues with another decoding iteration. When the hard decision determines that a codeword is not valid, a current number of iterations is preferably compared to a predetermined maximum iteration number and if the current number of iterations is equal to the predetermined maximum iteration number, a final value is preferably output.

Optionally, storing the calculated iterations of LLRs during iterations can comprises storing the calculated iterations of LLRs to the VRAM. In one embodiment, storing the calculated minimum values to random access memory can include storing the minimum and sub-minimum values in check node random access memory ("CRAM"). The method can also include providing a single lookup table which includes both threshold check values and attenuation and/or offset values.

Embodiments of the present invention also relate to a method for implementing a threshold modified min-sum algorithm for a low-density parity check ("LDPC") decoder including a check node unit calculating minimum and sub-minimum values of data, including converting log-likelihood ratios ("LLRs") into serial data and converting minimum data into serial data, the check node unit subtracting the minimum data from the LLRs via a plurality of full subtractor modules, the check node unit adding the LLRs with data from a lookup table via a plurality of full adder modules, storing calculated minimum and sub-minimum values, and after at each iteration, making a hard decision based on a sign of the calculated iteration of the variable node log-likelihood ratio to determine whether a codeword is valid. Optionally the lookup table can be used to reduce log-likelihood ratio ("LLR") values by multiplication and/or subtraction in a quantized LDPC decoder. Log-likelihood ratio values are preferably not consistently reduced by the same magnitude for all message values. In one embodiment, the LLR values are reduced or not reduced depending on a comparison of a LLR value with a threshold value greater than 0. The lookup table can be determined by the value of the multiplication and/or subtraction and the threshold. The lookup table can include minimum and sub-minimum data. In one embodiment, the lookup table can include both threshold values and attenuation and/or offset values. Optionally, the method attenuates and/or offsets values that are believed to be unreliable but does not attenuate and/or offset values that are believed to be reliable.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more embodiments of the invention and are not to be construed as limiting the invention. In the drawings.

DETAILED DESCRIPTION OF THE INVENTION

Figure 1:
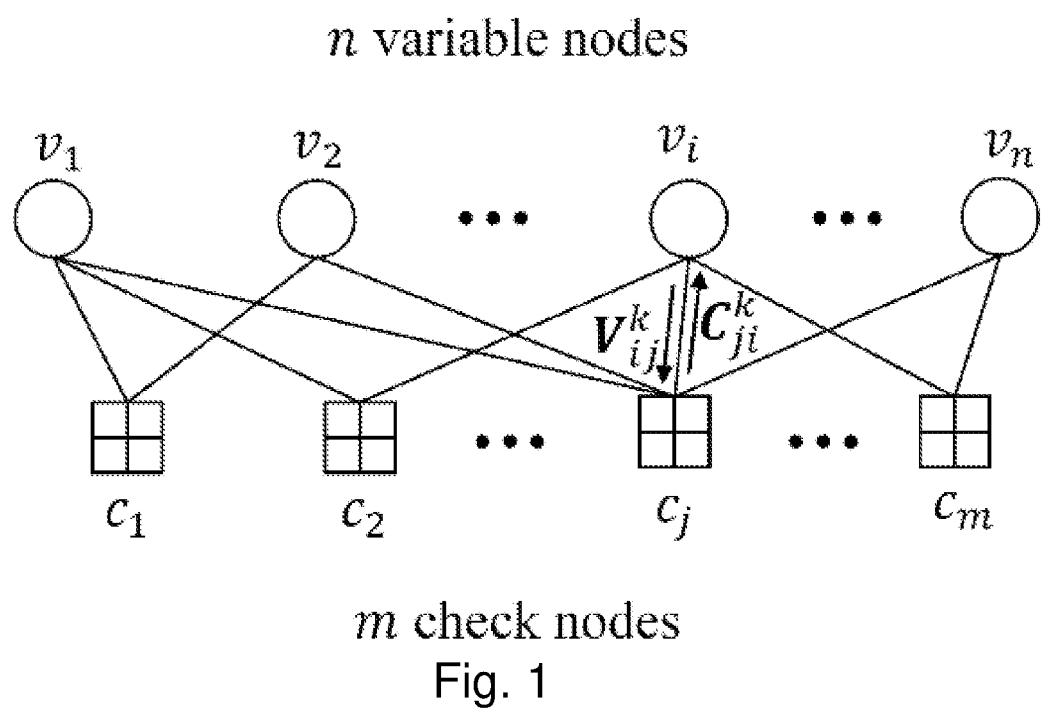
FIG. 1 is a drawing which illustrates a Tanner graph of an LDPC code.

Referring now to the figures, MP decoding of LDPC codes operates by iteratively exchanging messages in the Tanner graph of an LDPC code between variable nodes (white circles) and check nodes (plus boxes), (see FIG. 1). At the $k^{th}$ iteration, let $V_{ij}^k$ denote the LLR value passed from variable node $v_i$ to check node $c_j$ and let $C_{ji}^k$ denote the LLR value passed from check node $c_j$ to variable node $v_i$. The set of check nodes in the graph connected to $v_i$ are represented by $N(v_i)$ and the set of variable nodes connected to $c_j$ are represented by $N(c_j)$. Assume that codeword $u=(u_1, u_2, \ldots, u_n)$ is transmitted on an AWGN channel under binary phase shift keyed ("BPSK") modulation, where each zero is mapped to +1 and each one is mapped to −1. Let $p_0$ represent the probability that a 0 is received from the channel and let $p_1$ represent the probability that a 1 is received from the channel. Let $$r_i = \ln\left(\frac{p_0}{p_1}\right)$$

denote the LLR values received from channel for bit i. The MSA algorithm is initialized in iteration 0 by passing the received value $r_i$ from each variable node $v_i$ to the check nodes in $N(v_i)$ as $$V_{ij}^0 = r_i. \qquad \text{(Equation 1)}$$

Following initialization, the outgoing message from check node $C_{ji}^k$ to variable node $v_i$ at iteration k is given by $$C_{ji}^k = \left(\prod_{i' \in N(c_j)\backslash i} \text{sign}(V_{i'j}^k)\right) \cdot \min_{i' \in N(c_j)\backslash i} |V_{i'j}^k|, \qquad \text{(Equation 2)}$$

where $N(c_j)\backslash i$ denotes the set of all variable nodes connected to check node j except $v_i$. For iteration k>0, the outgoing message $V_{ij}^k$ from variable node $v_i$ to check node $c_j$ is given by $$V_{ij}^k = r_i + \sum_{j' \in N(v_i)\backslash j} C_{j'i}^k, \qquad \text{(Equation 3)}$$

where $N(v_i)\backslash j$ denotes the set of all check nodes connected to variable node i except $c_j$. After all check nodes and all variable nodes are updated, the hard decision estimate is computed $$\hat{u}_i^k = \begin{cases} 0, & r_i + \sum_{j \in N(v_i)} C_{ij}^k > 0, \\ 1, & r_i + \sum_{j \in N(v_i)} C_{ji}^k > 0. \end{cases} \qquad \text{(Equation 4)}$$

If the hard decision û is a codeword, decoding preferably stops, otherwise the decoder starts the next iteration until some pre-specified amount of decoder iterations $I_{max}$ are reached. To reduce the BER performance loss of MSA when compared to SPA, the attenuated (or normalized) MSA ("AMSA") has been proposed. AMSA operates as MSA, but where equation 2 is replaced by $$C_{ji}^k = \alpha \left(\prod_{i' \in N(c_j)\backslash i} \text{sign}(V_{i'j}^k)\right) \cdot \min_{i' \in N(c_j)\backslash i} |V_{i'j}^k|, \qquad \text{(Equation 5)}$$

and OMSA operates as MSA, but where equation 2 is replaced by $$C_{ji}^k = \left(\prod_{i' \in N(c_j)\setminus i} \text{sign}(V_{i'j}^k)\right) \cdot \max\left\{\min_{i' \in N(c_j)\setminus i} |V_{i'j}^k| - \beta, 0\right\}, \quad \text{(Equation 6)}$$

respectively, where $\alpha > 0$ and $\beta > 0$ are constants. AMSA and OMSA reduce the negative effect of overestimating the LLR magnitudes in MSA and improves performance in the low SNR region; however, neither of them necessarily achieves good performance in the high SNR region. Threshold AMSA ("TAMSA") and threshold OMSA ("TAMSA") are known to improve performance in high SNR region compared to AMSA and MSA. The new algorithm is based on the assumption that small problematic graphical objects, called trapping sets, are the major cause of the performance loss in high SNR. TAMSA operates as MSA, but where equation 2 is replaced by $$C_{ji}^k = \begin{cases} \left(\prod_{i' \in N(c_j)\setminus i} \text{sign}(V_{i'j}^k)\right) \cdot \min_{i' \in N(c_j)\setminus i} |V_{i'j}^k|, & \text{if } \min_{i' \in N(c_j)\setminus i} |V_{i'j}^k| \geq \tau, \\ \alpha\left(\prod_{i' \in N(c_j)\setminus i} \text{sign}(V_{i'j}^k)\right) \cdot \min_{i' \in N(c_j)\setminus i} |V_{i'j}^k|, & \text{otherwise,} \end{cases} \quad \text{(Equation 7)}$$

and TOMSA operates as MSA, but where equation 2 is replaced by $$C_{ji}^k = \begin{cases} \left(\prod_{i' \in N(c_j)\setminus i} \text{sign}(V_{i'j}^k)\right) \cdot \min_{i' \in N(c_j)\setminus i} |V_{i'j}^k|, & \text{if } \min_{i' \in N(c_j)\setminus i} |V_{i'j}^k| \geq \tau, \\ \left(\prod_{i' \in N(c_j)\setminus i} \text{sign}(V_{i'j}^k)\right) \cdot \max\left\{\min_{i' \in N(c_j)\setminus i} |V_{i'j}^k| - \beta, 0\right\}, & \text{otherwise.} \end{cases} \quad \text{(Equation 8)}$$

TAMSA and TOMSA locally reduce the magnitudes of the check node LLRs by adding a simple threshold test compared to AMSA (equation 5) and OMSA (equation 6), which improves the performance with a negligible complexity increase.

A layered version of TAMSA and TOMSA, with modified update rules can also be provided. The algorithm is initialized by (equation 1), then the outgoing message $V_{ij}^k$ at iteration $k > 0$ is replaced by $$V_{ij}^k = V_i^{k-1} - C_{ji}^{k-1}, \quad \text{(Equation 9)}$$

Where $C_{ji}^0 = 0$, and the outgoing message for some subset of check nodes is computed following equation 7 (TAMSA) or equation 8 (TOMSA). The choice of subsets will vary depending on the code and desired parallelization. Message $V_{ij}^k$ is updated again for the variable nodes connected to the selected subset of check nodes as $$V_{ij}^k = V_{ij}^k + C_j^k. \quad \text{(Equation 10)}$$

The decoder preferably repeats equations 7 (or 8) and 10 until all check nodes and variable nodes are updated. Finally, the hard decision estimate (equation 4) is replaced by $$\hat{u}_i^k = \begin{cases} 0, & V_i^k > 0, \\ 1, & V_i^k > 0. \end{cases} \quad \text{(Equation 11)}$$

If the hard decision $\hat{u}$ is a codeword, decoding stops, otherwise the decoder starts the next iteration from equation 9 until a pre-determined amount of decoder iterations $I_{max}$ are reached.

III. Finite Precision Representation of LLRS

Practical hardware implementation of LDPC decoders can rely on finite precision representation of LLRs. Clipping and quantization have effects on the MSA. Moreover, computer simulation or a quantized density evolution ("DE") algorithm can be used find the optimal attenuation or offset parameters $\alpha$ or $\beta$ from equations 5 and 6 for quantized AMSA and OMSA.

In one embodiment, a 5-bit quantizer can be used for LLR values where a 4-bit LUT can be used to map the magnitude of LLRs (and the LLRs after attenuation), and one extra bit for the sign of the LLRs. Table I illustrates the LUT that can be used to convert received floating-point LLRs to quantized LLRs, where the LLRs are represented as a range. This mapping is preferably done once in order to quantize $r_i$ as a 4-bit string with 1-bit sign. After this, all operations in equations 2-11 are preferably performed with (4+1) bit strings. Attenuation (multiplication by $\alpha$ in equation 5 or 7) and offset (subtraction of $\beta$ in equation 6 or 8) are preferably not computed in real-time, rather they are preferably computed in advance for each range of LLRs, for a given $\alpha$ and $\beta$, with a resulting LUT for the new mapping. The LUT for attenuation of the mapping in Table I with $\alpha = 0.8$ is illustrated in Table II. The LUT for offset of the mapping in Table I with $\beta = 0.15$ is illustrated in Table III. Threshold attenuation can optionally be achieved by modifying Table II. For example, for $\tau = 1.425$ and $\alpha = 0.8$, quantized LLRs smaller than 1010 will be attenuated according to equation 7. In this case, the TAMSA LUT will be the same as Table II for LLRs 0000 to 1001, but LLRs 1010 to 1111 will not be attenuated. Similarly, for the TOMSA LUT in the case of $\tau = 1.425$ and $\beta = 0.15$, it will be the same as Table III for LLRs 0000 to 1001, but LLRs 1010 to 1111 will not be attenuated.

TABLE I

FLOATING-POINT LLRs To 4-BIT STRINGS

| Received LLR | Map |
|---|---|
| [0, 0.075) | 0000 |
| [0.075, 0.225) | 0001 |
| [0.225, 0.375) | 0010 |
| [0.375, 0.525) | 0011 |
| [0.525, 0.675) | 0100 |
| [0.675, 0.825) | 0101 |
| [0.825, 0.975) | 0110 |
| [0.975, 1.125) | 0111 |
| [1.125, 1.275) | 1000 |
| [1.275, 1.425) | 1001 |
| [1.425, 1.575) | 1010 |
| [1.575, 1.725) | 1011 |
| [1.725, 1.875) | 1100 |
| [1.875, 2.025) | 1101 |

TABLE I-continued

FLOATING-POINT LLRs To 4-BIT STRINGS

| Received LLR | Map |
|---|---|
| [2.025, 2.175) | 1110 |
| [2.175, ∞) | 1111 |

TABLE II

ATTENUATED 4-BIT STRINGS FOR α = 0.8

| LLR | Attenuated LLR |
|---|---|
| 0000 | 0000 |
| 0001 | 0001 |
| 0010 | 0010 |
| 0011 | 0010 |
| 0100 | 0011 |
| 0101 | 0100 |
| 0110 | 0101 |
| 0111 | 0110 |
| 1000 | 0110 |
| 1001 | 0111 |
| 1010 | 1000 |
| 1011 | 1001 |
| 1100 | 1010 |
| 1101 | 1010 |
| 1110 | 1011 |
| 1111 | 1100 |

TABLE III

OFFSET 4-BIT STRINGS FOR β = 0.15

| LLR | Offset LLR |
|---|---|
| 0000 | 0000 |
| 0001 | 0000 |
| 0010 | 0001 |
| 0011 | 0010 |
| 0100 | 0011 |
| 0101 | 0100 |
| 0110 | 0101 |
| 0111 | 0110 |
| 1000 | 0111 |
| 1001 | 1000 |
| 1010 | 1001 |
| 1011 | 1010 |
| 1100 | 1011 |
| 1101 | 1100 |
| 1110 | 1101 |
| 1111 | 1110 |

The LUT approach detailed above is the preferable method to combine attenuation and/or offset with the threshold check (equations 7 or 8) in a single LUT; however, the same result can be obtained by conventional computation of the minimum value in equation 2, followed by a comparison with the threshold value, and then either applying attenuation/offset or not depending on the result of the threshold value check. Attenuation and/or offset, when necessary, can be achieved in the conventional way by a LUT or alternative circuitry to perform the quantized computation.

Figure 2:
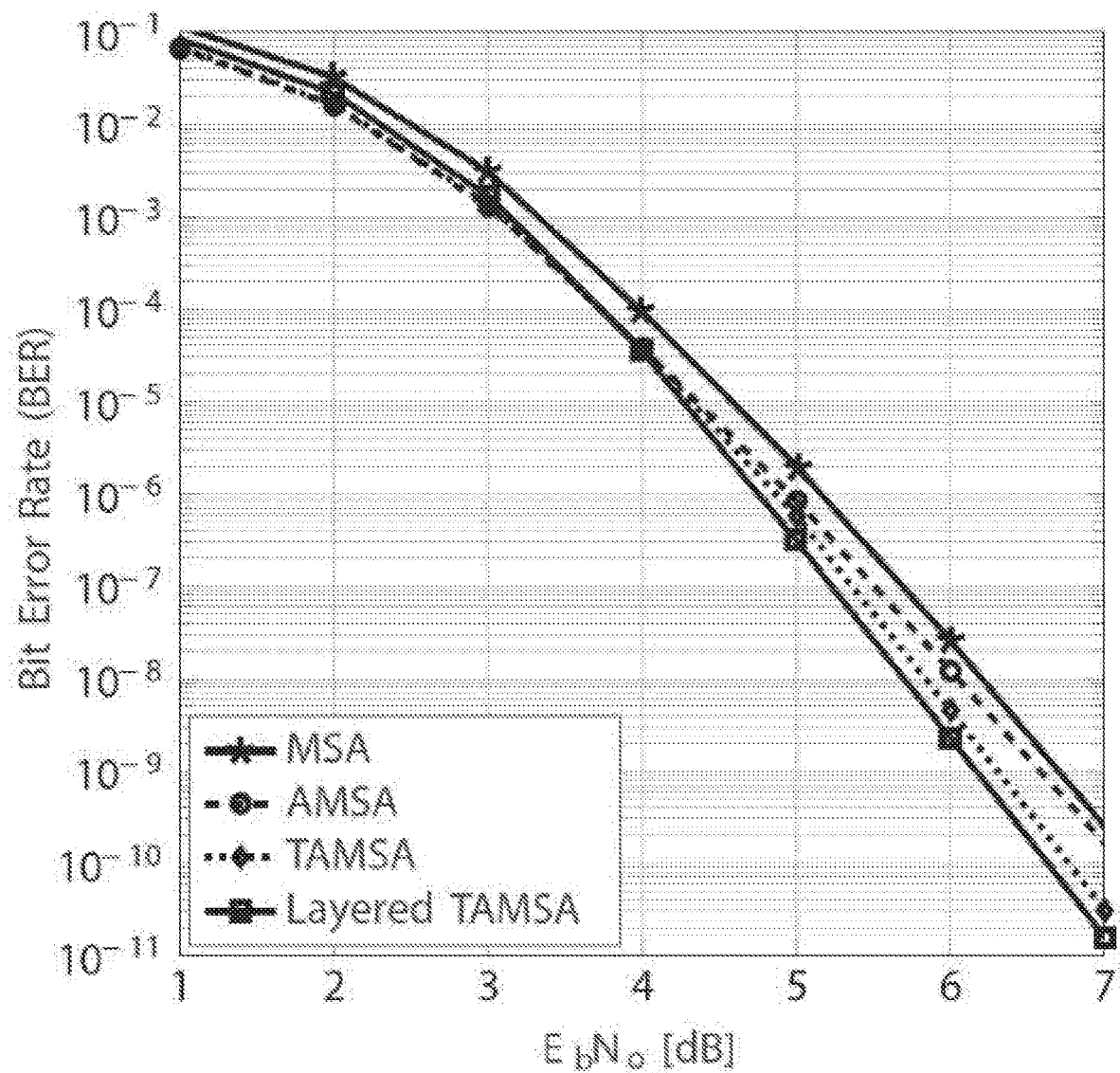
FIG. 2 is a drawing which illustrates simulation results comparing the decoding performance of quantized MSA, AMSA, TAMSA, and layered TAMSA for a (155, 64) QC Tanner LDPC code.

FIG. 2 illustrates simulation results for quantized MSA, AMSA, TAMSA, and layered TAMSA with an attenuation factor α=0.8 for all attenuated algorithms and a threshold τ=1.425 for threshold algorithms (using the LUTs as described above). In running data for this example, all algorithms were allowed a maximum of 100 iterations. Both TAMSA and layered TAMSA result in significantly improved performance over the AMSA and MSA; with the best performance resulting from layered TAMSA, which offers close to 0.4 dB gain at a BER equal to $10^{-9}$ over AMSA and MSA.

Another important metric related to decoder power consumption is the average number of iterations ("ANI") performed for each algorithm. The results are summarized in Table IV. Both AMSA and TAMSA provided a significant reduction in the average number of iterations when compared to MSA at low SNR, with similar numbers elsewhere.

IV. System Design Considerations

As an example, a layered TAMSA can be implemented with a (155, 64) QC Tanner code. Using this particular LDPC code as an example, the corresponding decoder hardware for implementation of it will now be described.

LDPC codes. The parity-check matrix of the (155, 64) QC Tanner code is given by $$H = \begin{bmatrix} I_1 & I_2 & I_4 & I_8 & I_{16} \\ I_5 & I_{10} & I_{20} & I_9 & I_{18} \\ I_{25} & I_{19} & I_7 & I_{14} & I_{28} \end{bmatrix}, \quad \text{(Equation 12)}$$

where $I_x$ is a 31×31 identity matrix with rows shifted cyclically to the left by x positions. According to this specific QC structure, a full-parallel architecture can be used to implement layered MSA, layered AMSA, and layered TAMSA to speed up the decoding process. Specifically, 31 check node unit ("CNU") modules can optionally be used in the LDPC decoder.

At each iteration, message $V_{ij}^k$ is preferably computed by equation 9. $C_{ji}^k$ can then be computed using equations 2, 5, 6, 7, or 8, where appropriate, for the first 31 rows in parallel (j=1, 2, . . . , 31), then all connected variable node LLRs can be updated using $V_{ij}^k$ by using equation 10. This is preferably repeated for the next 31 rows (j=32, 33, . . . , 62), and then the final 31 rows (j=63, 64, . . . , 93) in the parity-check matrix of equation 12. After these three batches of parallel computation, one iteration is completed and the iteration number increases by 1, and the sign of the LLRs is calculated for the hard decision according to equation 11. The decoder stops either if the hard decisions give a valid codeword or the iteration number achieves a preset maximum iteration number $I_{max}$.

Figure 3:
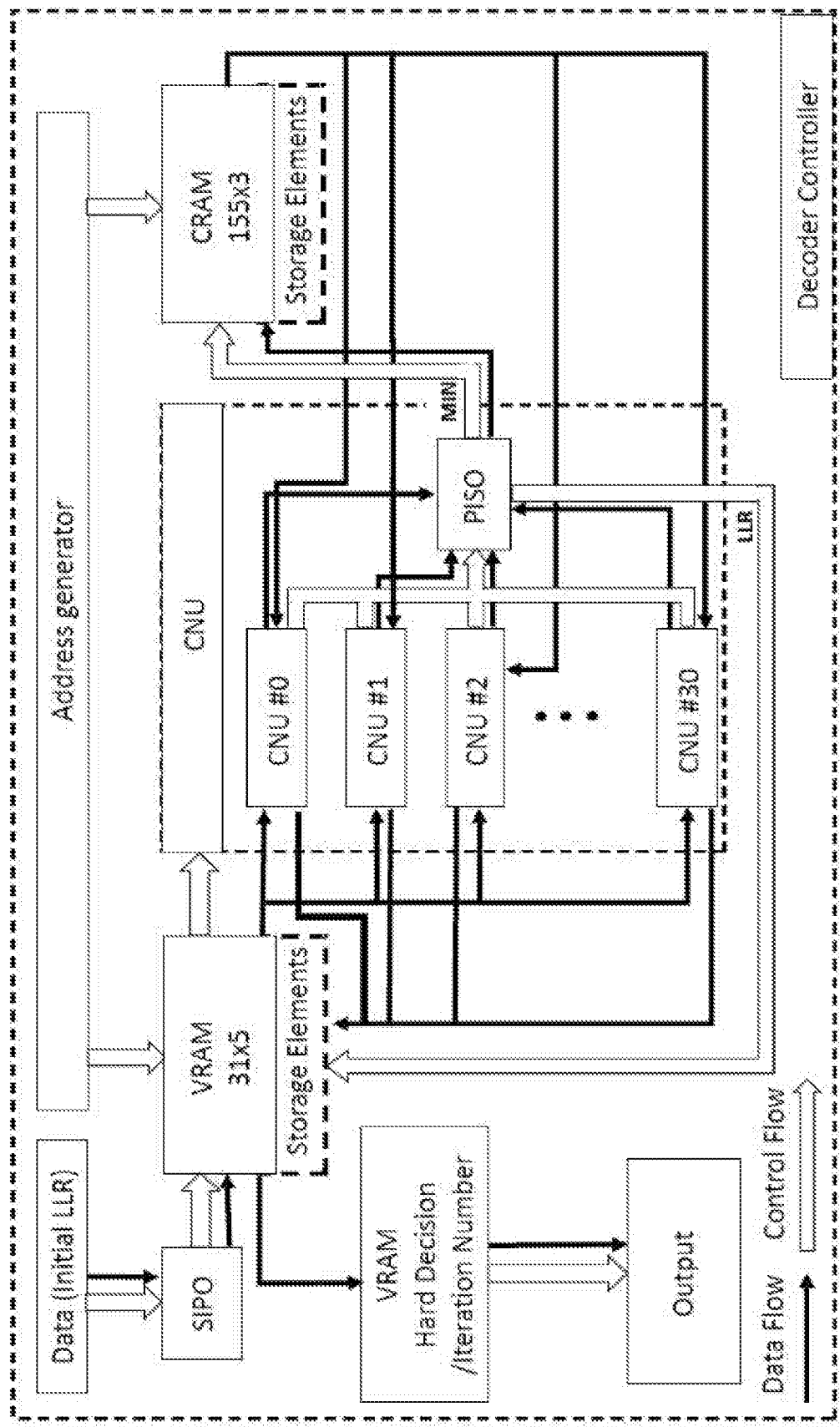
FIG. 3 is a drawing which illustrates a system diagram of an embodiment of the present invention.

System Design. The decoder system preferably includes several building blocks, as illustrated in FIG. 3, where the black arrows represent data flow and the white arrows represent control flow. The input serial data $V_{ij}^0$ is preferably first converted into parallel data by the serial-in parallel-out ("SIPO"). The data is then preferably stored in random access memory ("RAM"). Because this data contains variable node values, we refer to it as variable node RAM ("VRAM"). The VRAM also preferably stores the temporary variable node LLRs V during the decoding process. The decoder controller preferably controls the decoding process, and the values of check nodes and variable nodes are updated according to the status of the decoder controller. First, according to the parity check matrix of the (155, 64) QC Tanner code in equation 12, the decoder controller preferably asks the address generator to generate several addresses to access the data $V_{ij}^k$ stored in VRAM. Then, this data is sent to the CNU, where the minimum values and sub-minimum (second minimum) values are calculated for use in equations 2, 5, 6, 7, or 8, the decoder controller then preferably asks the address generator to generate addresses to store the minimum and sub-minimum values—most preferably for storage into check node random access memory ("CRAM"). Meanwhile, $V_{ij}^{k}$ is computed according to equation 10 and stored back into the VRAM. After a decoding iteration is complete, the decoder controller preferably asks the VRAM hard decision to make a hard decision according to the sign of LLRs and decide whether it is a valid codeword (which means the decoding is successful). If it is successful, the final data is preferably sent to the output of the decoder. If not, the decoder controller preferably compares the number of current iterations with a predetermined maximum iteration number $I_{max}$. If the number of iterations is smaller than $I_{max}$, the decoder preferably starts the next iteration of decoding, computing $V_{ij}^{k}$ using equation 9 and updating the VRAM, otherwise, the decoder controller preferably finishes the decoding process and outputs the result from the VRAM.

TABLE IV

AVERAGE NUMBER OF ITERATIONS RECORDED
FOR THE (155, 64) QC TANNER CODE

| $E_b/N_0$ | MSA [17] | AMSA [17] | TAMSA [17] |
|---|---|---|---|
| 1 dB | 68.95 | 59.28 | 59.24 |
| 2 dB | 30.4 | 23.13 | 22.9 |
| 3 dB | 7.82 | 6.28 | 6.2 |
| 4 dB | 3.06 | 2.95 | 2.87 |
| 5 dB | 1.97 | 1.98 | 1.98 |
| 6 dB | 1.44 | 1.46 | 1.46 |
| 7 dB | 1.09 | 1.10 | 1.10 |
| 8 dB | 0.85 | 0.86 | 0.86 |

Figure 4:
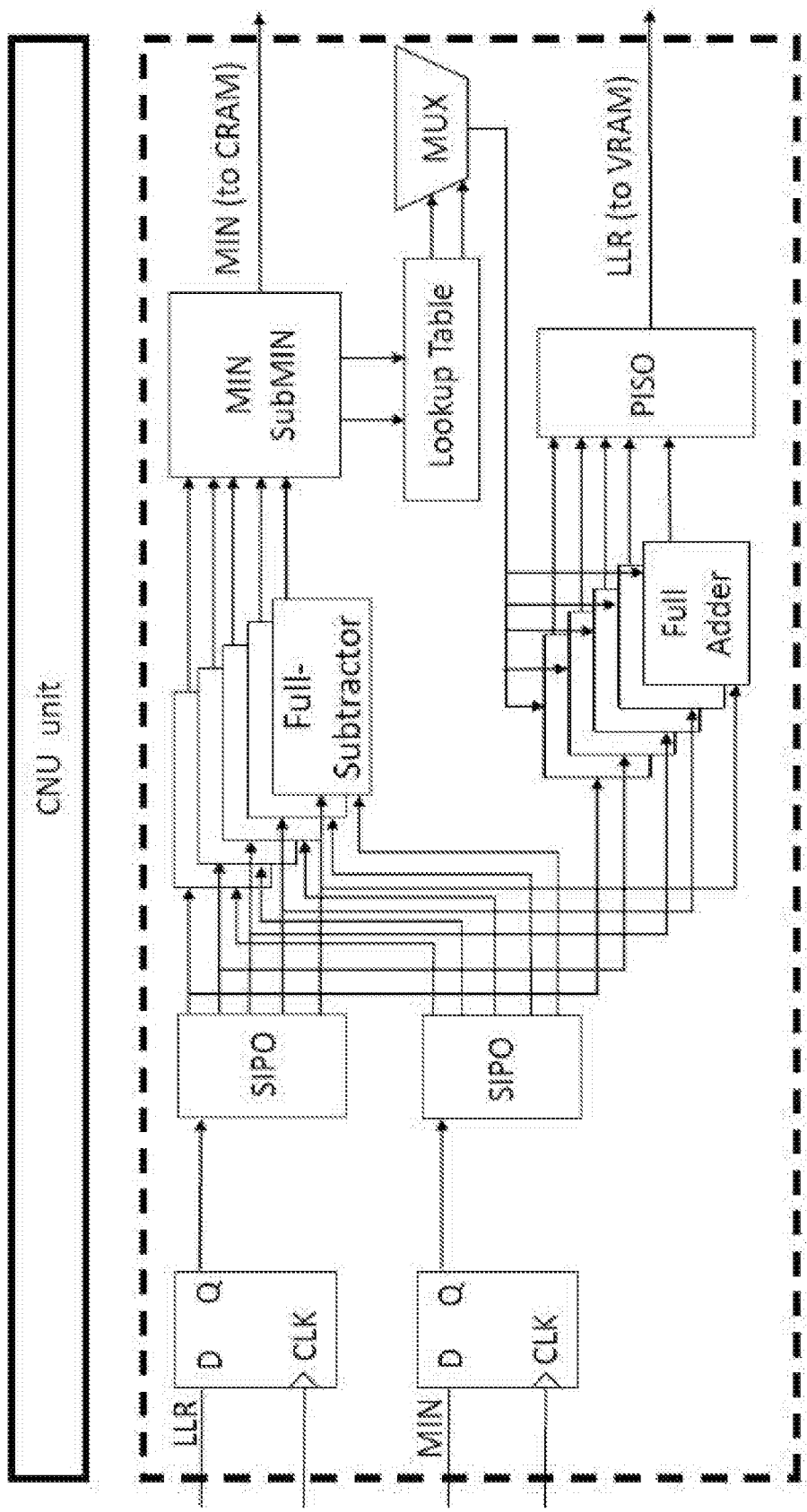
FIG. 4 is a drawing which illustrates CNU Architecture of an embodiment of the present invention.
Figure 5:
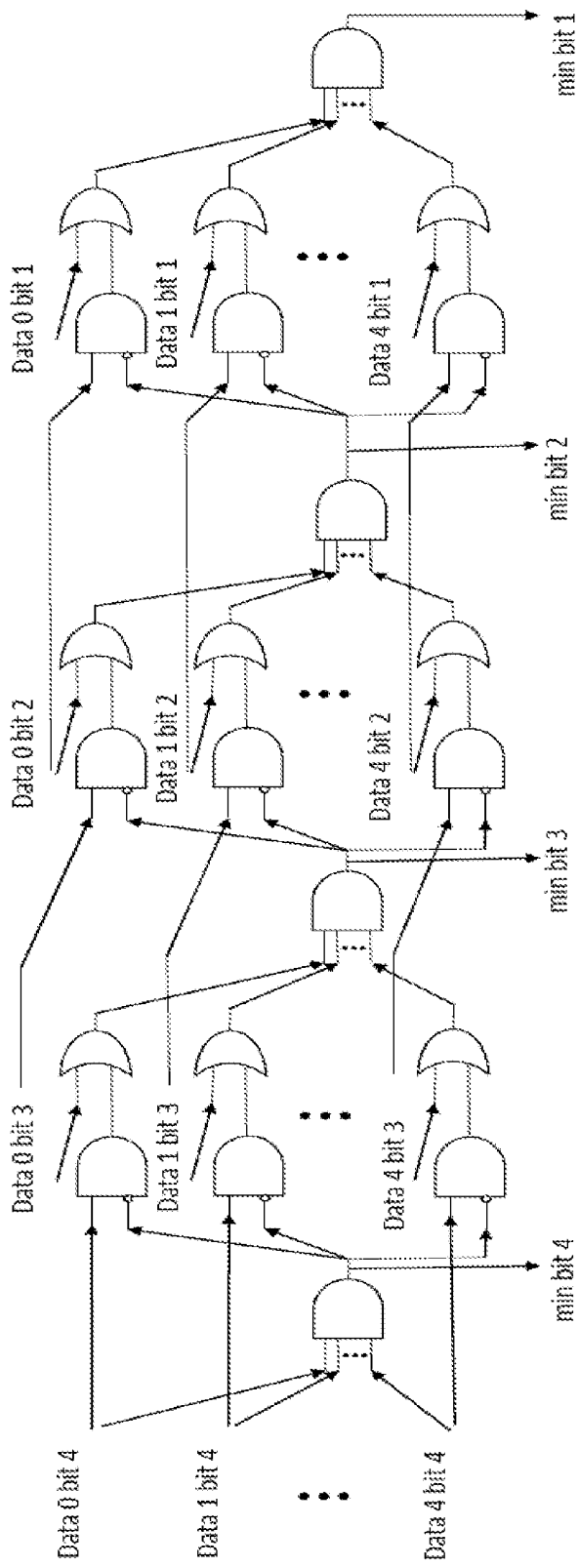
FIG. 5 is a drawing which illustrates circuit architecture for minimum computation.

To implement the CNU (FIG. 4), the full-parallel structure previously described is preferably implemented. For the CNU unit, the LLRs and minimal values from previous iteration are preferably sent to the unit serially, where two SIPO units are applied. In one embodiment, there can be five full-subtractor modules used to implement equation 9, and five full-adder modules that are preferably used to implement equation 10. The reason that five full modules are used for each in this case is because there are five columns in the H matrix of equation 12. Embodiments of the present invention will, in general, preferably use $|N(c\_j)|$ full-subtractor modules to implement equation 9, and $|N(c\_j)|$ full-adder modules to implement equation 10 such that the number of each module is preferably equal to the number of ones in a given row j of the parity-check matrix. The sign and the magnitude values to be sent to each variable node are preferably calculated separately. First, the signs of all variable nodes connected to this check node are multiplied together to form $\Pi_{i \in N(c_j)}$ sign $(V_{ij})$. The sign of the outgoing message to each variable node is preferably computed by multiplying $\Pi_{i \in N(c_j)}$ sign $(V_{ij})$ with the sign of the corresponding variable node. Second, the minimum value $$\min_{i' \in N(c_j) \setminus i} |V_{i'j}^{k}|$$

is now preferably computed. Embodiments of the present invention preferably use a parallel circuit design to determine both the minimum and sub-minimum values of incoming LLRs in order to efficiently select this minimum value for each of the connected variable nodes, thus providing a very fast CNU module. The preferred architecture used to determine the minimum is illustrated in FIG. 5. In this embodiment, there are five 4-bit inputs corresponding to the five incoming quantized LLRs (Data i bit 1, Data i bit 2, . . . , Data i bit 4, for i=0, 1, . . . , 4) and one 4-bit output (min bit 1, min bit 2, . . . , min bit 4). The circuit to determine the sub-minimum value is preferably similar, except that it has four 4-bit data inputs because the previously found minimum value is preferably not used. $M_{1,j}$ represents the minimum value and $M_{2,j}$ represents the sub-minimum value input to Finally, the CNU preferably compares each value of the variable node with $M_{1,j}$ to determine the minimum value, if the variable node message $V_{ij}^{k}$ equals $M_{1,j}$, $M_{2,j}$ is preferably assigned as the minimum value in equations 2, 5, 6, 7, and 8, otherwise, $M_{1,j}$ is preferably used for the minimum value. Using this method avoids multiple calculations to update each check node. Layered AMSA/OMSA and layered TAMSA/TOMSA require an additional LUT for attenuation/offset compared to layered MSA; however, the hardware costs are preferably the same for each case. Although this discussion has focused on the implementation of the (155, 64) QC Tanner code, the above architecture also suitably generalizes for other QC LDPC codes.

TABLE V

COMPARISON OF HARDWARE RESOURCES

| | Layered MSA | Layered AMSA | Layered TAMSA |
|---|---|---|---|
| LUT | 14.9k | 14.9k | 14.9k |
| Flip-flop ("FF") | 10.4k | 10.4k | 10.4k |
| Block RAM ("BRAM") | 13.50 | 13.50 | 13.50 |
| Leaf cells | 2830 | 2832 | 2832 |
| Power (CLK1) | 38480011.06 | 38480011.06 | 38480011.06 |
| Area (CLK1) | 72314.61 | 72314.61 | 72314.61 |
| Power (CLK2) | 9854972.14 | 9854972.14 | 9854972.14 |
| Area (CLK2) | 71167.19 | 71167.19 | 71167.19 |

The comparison of hardware resources used in layered MSA, layered AMSA, and layered TAMSA are summarized in Table V. The power and area of layered MSA, AMSA, and TAMSA are the same, when the clock is 500 MHz (CLK1) and 100 MHz (CLK2), respectively. The data comparison illustrates that layered TAMSA requires no extra hardware resources compare to layered AMSA, and both attenuated algorithms require only 0.07% extra leaf cells compared to conventional layered MSA.

In one embodiment, for low-power hardware design considerations, the use of a full-parallel architecture is preferred over a pipeline structure because, in one embodiment, the layered decoder uses a complete computation of the first 31 rows in the parity-check matrix to continue the computation of the following 31 rows. However, for different LDPC codes, a pipeline structure can provide desirable results— particularly in order to speed up the decoding process. The LUT-based TAMSA/TOMSA approach described above can be applied similarly to pipeline or any other decoder implementations.

The preceding examples can be repeated with similar success by substituting the generically or specifically described components and/or operating conditions of embodiments of the present invention for those used in the preceding examples.

Optionally, embodiments of the present invention can include a general or specific purpose computer or distributed system programmed with computer software implementing steps described above, which computer software may be in any appropriate computer language, including but not limited to C++, FORTRAN, BASIC, Java, Python, Linux, assembly language, microcode, distributed programming languages, etc. The apparatus may also include a plurality of such computers/distributed systems (e.g., connected over the Internet and/or one or more intranets) in a variety of hardware implementations. For example, data processing can be performed by an appropriately programmed microprocessor, computing cloud, Application Specific Integrated Circuit (ASIC), Field Programmable Gate Array (FPGA), or the like, in conjunction with appropriate memory, network, and bus elements. One or more processors and/or microcontrollers can operate via instructions of the computer code and the software is preferably stored on one or more tangible non-transitive memory-storage devices.

Although the terms VRAM and CRAM are used to designate where different values are most preferably stored, in one embodiment VRAM and CRAM can comprise one or more non-specific random access memory "RAM" chips and/or cards—thus in one embodiment, values that are most preferably stored on VRAM can be stored on the same RAM device as values which are referred to as preferably being stored on CRAM. Note that in the specification and claims, "about" or "approximately" means within twenty percent (20%) of the numerical amount cited. All computer software disclosed herein may be embodied on any non-transitory computer-readable medium (including combinations of mediums), including without limitation CD-ROMs, DVD-ROMs, hard drives (local or network storage device), USB keys, other removable drives, ROM, and firmware.

Embodiments of the present invention can include every combination of features that are disclosed herein independently from each other. Although the invention has been described in detail with particular reference to the disclosed embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference. Unless specifically stated as being "essential" above, none of the various components or the interrelationship thereof are essential to the operation of the invention. Rather, desirable results can be achieved by substituting various components and/or reconfiguring their relationships with one another.

What is claimed is:

1. A method for implementing a threshold modified min-sum algorithm for a low-density parity check ("LDPC") decoder comprising:
   quantization of received channel values;
   obtaining parallel input data;
   storing the parallel input data;
   based on data contained in a parity check matrix, a decoding controller causing an address generator to generate addresses to access stored data;
   passing data to a check node unit ("CNU");
   the CNU calculating a minimum value of the data passed to the CNU;
   applying an offset value and/or attenuation value to the calculated minimum value if a magnitude of the calculated minimum value comprises a magnitude less than a threshold value and not applying the offset value and/or attenuation value to the magnitude of the calculated minimum value if the magnitude of the calculated minimum value is greater than the threshold value;
   storing the calculated minimum value;
   calculating iterations of variable node log-likelihood ratios ("LLRs") and storing the calculated iterations of LLRs;
   after each iteration, making a hard decision based on a sign of the calculated iteration of the variable node LLR to determine whether a codeword is valid; and
   when the hard decision determines that the codeword is valid, passing final data to an output.

2. The method of claim 1 wherein obtaining parallel input data comprises the CNU converting serial input into parallel data and the CNU processing the parallel data in a parallel architecture.

3. The method of claim 1 wherein the CNU calculating a minimum value of the data passed to the CNU comprises the CNU calculating minimum and sub-minimum values of the data passed to the CNU and wherein storing the calculated minimum value comprises storing the calculated minimum and sub-minimum values.

4. The method of claim 3 wherein a circuit used to calculate a sub-minimum value comprises one less data input than a circuit used to calculate a minimum value.

5. The method of claim 3 wherein when a variable node message is equal to a minimum value, the calculated sub-minimum value is assigned as the minimum value for calculations in the CNU.

6. The method of claim 1 wherein when a variable node message is not equal to a minimum value, the calculated minimum value is assigned as the minimum value for calculations in the CNU.

7. The method of claim 1 wherein quantized LLR values are assigned according to a lookup table and all decoder operations are performed on corresponding binary value strings.

8. The method of claim 1 wherein the CNU converts LLRs from previous iterations into parallel data and wherein the CNU converts minimum values from previous iterations into parallel data and passes LLRs from previous iterations and minimum values from previous iterations to a plurality of full subtractor modules and wherein parallel outputs of the LLRs are also passed to a plurality of full adder modules.

9. The method of claim 8 wherein the plurality of full adder modules adds the LLRs with data from a lookup table.

10. The method of claim 8 wherein sign and magnitude values to be sent to nodes are calculated separately from one another.

11. The method of claim 8 wherein the plurality of full subtractor modules is based on data contained in a parity-check matrix.

12. The method of claim 8 wherein the plurality of full adder modules is based on data contained in a parity check matrix.

13. The method of claim 1 wherein signs of all variable nodes connected to a check node are multiplied together.

14. The method of claim 1 wherein a sign of an outgoing message to each variable node is computed by multiplying with a sign of a corresponding variable node.

15. The method of claim 1 wherein when the hard decision determines that the codeword is not valid, a current number of iterations is compared to a predetermined maximum iteration number and if the current number of iterations is smaller than the predetermined maximum iteration number, the method continues with another decoding iteration.

16. The method of claim 1 wherein when the hard decision determines that the codeword is not valid, a current number of iterations is compared to a predetermined maximum iteration number and if the current number of iterations is equal to the predetermined maximum iteration number, a final value is output.

17. The method of claim 1 wherein storing the calculated iterations of LLRs during iterations comprises storing the calculated iterations of LLRs to a random access memory.

18. The method of claim 3 wherein storing the calculated minimum value comprises storing the minimum and sub-minimum values in a check node random access memory.

19. The method of claim 1 further comprising providing a single lookup table which includes both threshold check values and attenuation and/or offset values.

20. A method for implementing a threshold modified min-sum algorithm for a low-density parity check ("LDPC") decoder comprising:
    a check node unit calculating minimum and sub-minimum values of data, including converting log-likelihood ratios ("LLRs") into serial data and converting minimum data into serial data;
    the check node unit subtracting the minimum data from the LLRs via a plurality of full subtractor modules;
    storing calculated minimum and sub-minimum values;
    applying an offset value and/or attenuation value to the calculated minimum value if a magnitude of the calculated minimum value comprises a magnitude less than a threshold value and not applying the offset value and/or attenuation value to the magnitude of the calculated minimum value if the magnitude of the calculated minimum value is greater than the threshold value and
    after at each iteration, making a hard decision based on a sign of the calculated iteration of the variable node log-likelihood ratio to determine whether a codeword is valid.

21. The method of claim 20 wherein applying an offset value to the calculated minimum value comprises applying an offset value that is stored in a lookup table to reduce log-likelihood ratio ("LLR") values by multiplication and/or subtraction in a quantized LDPC decoder.

22. The method of claim 21 wherein log-likelihood ratio values are not consistently reduced by the same magnitude for all message values.

23. The method of claim 21 wherein the lookup table is determined by a value of the multiplication and/or subtraction and the threshold.

24. The method of claim 21 wherein the lookup table comprises data including minimum and sub-minimum data.

25. The method of claim 21 wherein the lookup table comprises both threshold values and attenuation and/or offset values.

26. The method of claim 20 wherein the method attenuates and/or offsets values that are believed to be unreliable but does not attenuate and/or offset values that are believed to be reliable.

* * * * *